United States Patent
Huang

(10) Patent No.: US 9,521,784 B1
(45) Date of Patent: Dec. 13, 2016

(54) ELECTRONIC DEVICE WITH A FAN MODULE

(71) Applicants: Inventec (Pudong) Technology Corporation, Shanghai (CN); INVENTEC CORPORATION, Taipei (TW)

(72) Inventor: Wen-Long Huang, Shanghai (CN)

(73) Assignees: INVENTEC (PUDONG) TECHNOLOGY CORPORATION, Shanghai (CN); INVENTEC CORPORATION, Taipei (TW)

(*) Notice: Subject to any disclaimer, the term of this patent is extended or adjusted under 35 U.S.C. 154(b) by 0 days.

(21) Appl. No.: 14/808,545

(22) Filed: Jul. 24, 2015

(30) Foreign Application Priority Data

Jun. 9, 2015 (CN) .......................... 2015 1 0311985

(51) Int. Cl.
*H05K 7/14* (2006.01)
*H05K 7/20* (2006.01)

(52) U.S. Cl.
CPC ........ *H05K 7/20736* (2013.01); *H05K 7/1489* (2013.01); *H05K 7/1492* (2013.01)

(58) Field of Classification Search
CPC ............ H05K 7/20736; H05K 7/20136; H05K 7/20172; H05K 7/20554; H05K 7/20563; H05K 7/20572; H05K 7/20718; H05K 7/20727; H05K 7/1491; H05K 7/1492; H05K 7/1489
USPC .................. 361/678, 679.47–679.5, 690–697
See application file for complete search history.

(56) References Cited

U.S. PATENT DOCUMENTS

| | | | | |
|---|---|---|---|---|
| 6,388,880 B1* | 5/2002 | El-Ghobashy | ..... | H05K 7/20581 165/104.33 |
| 7,277,281 B1* | 10/2007 | Lu | ....... | H01L 23/4006 165/104.21 |
| 9,265,175 B2* | 2/2016 | Yoshida | ............. | H05K 7/20172 |
| 2004/0115986 A1* | 6/2004 | Chen | ..................... | F04D 29/601 439/485 |
| 2005/0227608 A1* | 10/2005 | Wu | ..................... | H05K 7/20172 454/184 |
| 2007/0047201 A1* | 3/2007 | Yu | ....................... | F04D 25/0693 361/695 |
| 2007/0217910 A1* | 9/2007 | Chang | ................ | H05K 7/20172 415/213.1 |
| 2008/0014093 A1* | 1/2008 | Fan | ....................... | F04D 29/601 416/244 R |

(Continued)

*Primary Examiner* — Adam B Dravininkas
(74) *Attorney, Agent, or Firm* — Maschoff Brennan

(57) ABSTRACT

An electronic device includes a case, a mother board disposed on the case and a fan module disposed on the case. The fan module includes a frame, adapters and a transmission assembly. The frame has an air path. The adapters are mounted on the frame. Each adapter includes a first connector and a second connector. The first connector is attached to the frame. The second connector is inserted into the frame and located within the air path. The transmission assembly includes third connectors, a fourth connector, a fifth connector and a cable set, the cable set connected to the third connectors, the fourth connector and the fifth connector. The third connectors are detachably plugged into the first connector. The fourth connector and the fifth connector are plugged into the mother board. Each fan unit has a sixth connector which is plugged into the second connector.

16 Claims, 7 Drawing Sheets

(56) References Cited

U.S. PATENT DOCUMENTS

| | | | | |
|---|---|---|---|---|
| 2009/0244845 A1* | 10/2009 | Nagamoto | ......... | H05K 7/20918 |
| | | | | 361/697 |
| 2010/0014250 A1* | 1/2010 | Kitahara | ................ | A61B 8/546 |
| | | | | 361/695 |
| 2013/0100613 A1* | 4/2013 | Nakai | ................ | H05K 7/20563 |
| | | | | 361/695 |
| 2014/0055952 A1* | 2/2014 | Sun | .................... | H05K 7/20172 |
| | | | | 361/695 |
| 2015/0116976 A1* | 4/2015 | Ritter | .................. | H01B 7/2813 |
| | | | | 361/826 |

* cited by examiner

ELECTRONIC DEVICE WITH A FAN MODULE

CROSS-REFERENCE TO RELATED APPLICATIONS

This non-provisional application claims priority under 35 U.S.C. §119(a) on Patent Application No(s). 201510311985.4 filed in China, on Jun. 9, 2015, the entire contents of which are hereby incorporated by reference.

BACKGROUND OF THE INVENTION

Technical Field of the Invention

The disclosure relates to an electronic device, more particularly to an electronic device without a fan back plate.

Description of the Related Art

With the development of technology, electronic devices are designed to be lighter, thinner, shorter and smaller, electronic components therein are accordingly miniaturized, and the electronic components are tightly arranged in a case thereof, so that the heat produced from the electronic components is increased as well. Due to the high temperature, the operation and the efficiency of the electronic device become unstable, affecting the lifespan of the electronic device. Hence, a heat dissipating device is adopted to dissipate the heat in the electronic device.

Take a server for example, in general, the server has higher heat dissipation requirement, thus a fan array which includes a plurality of fans are disposed inside the server for improving the capability of heat dissipation. The fan array usually is mounted on a case of the server via a fan frame, and electrically connected to a mother board via a fan back plate which is a circuit board. Accordingly, the fan array is able to be efficiently installed to the server. However, the disposition of the fan back plate may increase the manufacturing cost of the server.

In addition, the space in the server is occupied by the fan back plate, and that makes the volume of the server unable to be reduced.

Therefore, manufacturers are constantly trying to reduce the manufacturing cost of the server, and to improve the use of the space in the server as well as maintaining the efficiency of the installation of the fan array.

SUMMARY OF THE INVENTION

One embodiment of the disclosure provides an electronic device including a case, a mother board and a fan module. The mother board is disposed on the case. The fan module is disposed on the case. The fan module includes a frame, a plurality of adapters and a transmission assembly. The frame includes a base and two side plates. The base has a top surface and a bottom surface. Two side plates are connected to two sides of the base that are opposite to each other. The top surface of the base and two side plates together form at least one air path. One of the two side plates has a cable-management opening. The bottom surface of the base has a cable-management groove and a plurality of cable-management members. One end of the cable-management groove is connected to the cable-management opening. The cable-management members are adjacent to the cable-management groove. The adapters are mounted on the base of the frame. Each adapter includes a first connector and a second connector. A plugging direction of the first connector and a plugging direction of the second connector are substantially orthogonal to each other. The first connector is attached to the bottom surface of the base. The second connector is inserted on the base, protruding outward from the top surface of the base and located within the air path. The transmission assembly includes a plurality of third connectors, a fourth connector, a fifth connector and a cable set. The cable set is connected to the third connectors and the fourth connector and connected to the third connectors and the fifth connector. The third connectors are detachably plugged into the first connector, respectively. The fourth connector and the fifth connector are located at an end of the cable set which is opposite to the third connectors. The transmission assembly passes through the frame from the cable-management opening via the cable-management members and the cable-management groove for allowing the fourth connector and the fifth connector to be located out of the frame and detachably plugged into the mother board. Each fan units includes a sixth connector. The fan units are located within the air path, and the sixth connector is detachably plugged into the second connector, and the fan units are for being electrically connected to the mother board through the transmission assembly.

BRIEF DESCRIPTION OF THE DRAWINGS

The present disclosure will become more fully understood from the detailed description given herein below and the accompanying drawings which are given by way of illustration only and thus are not limitative of the present disclosure and wherein.

DETAILED DESCRIPTION

Figure 1:
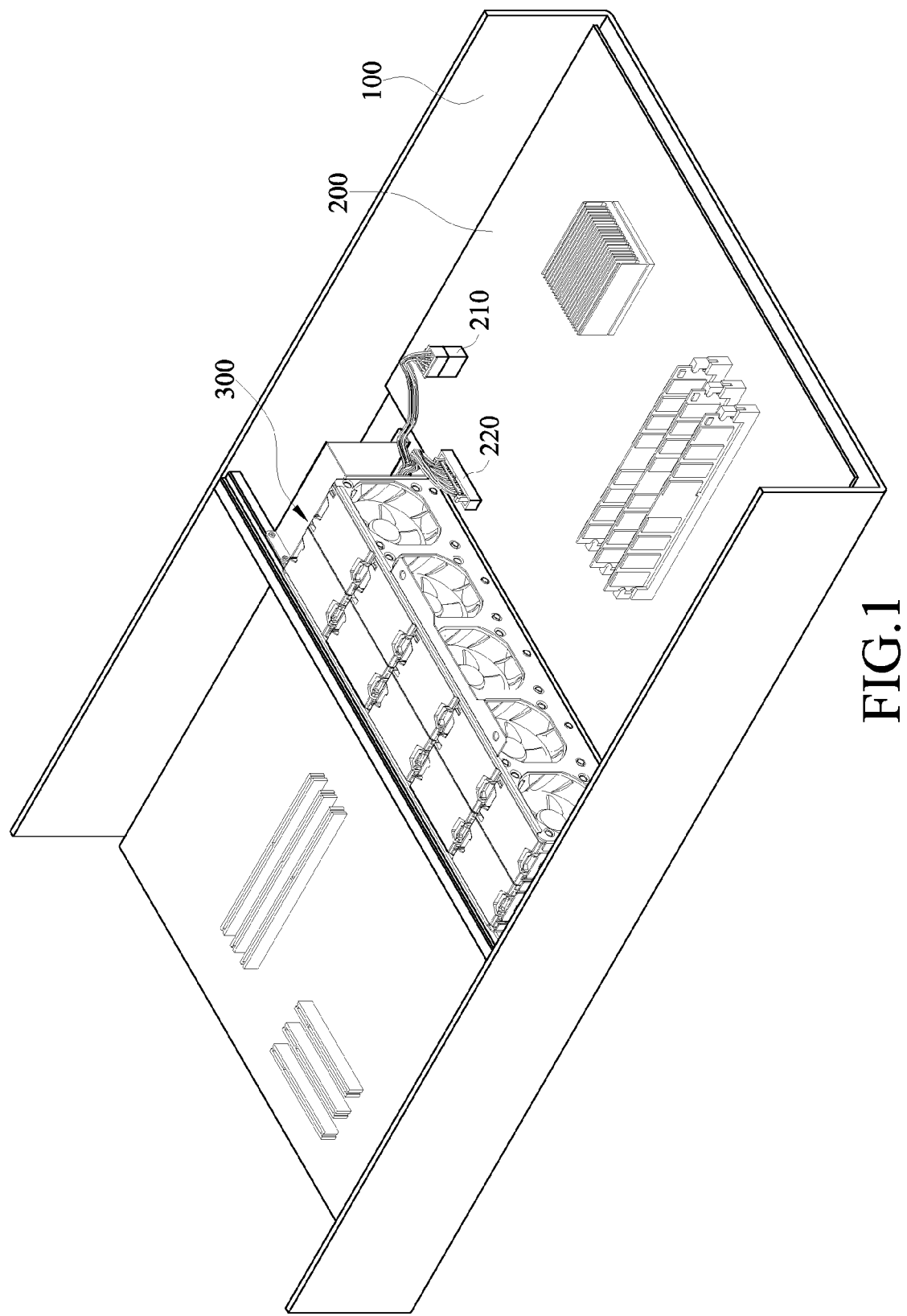
FIG. 1 is a perspective view of an electronic device according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
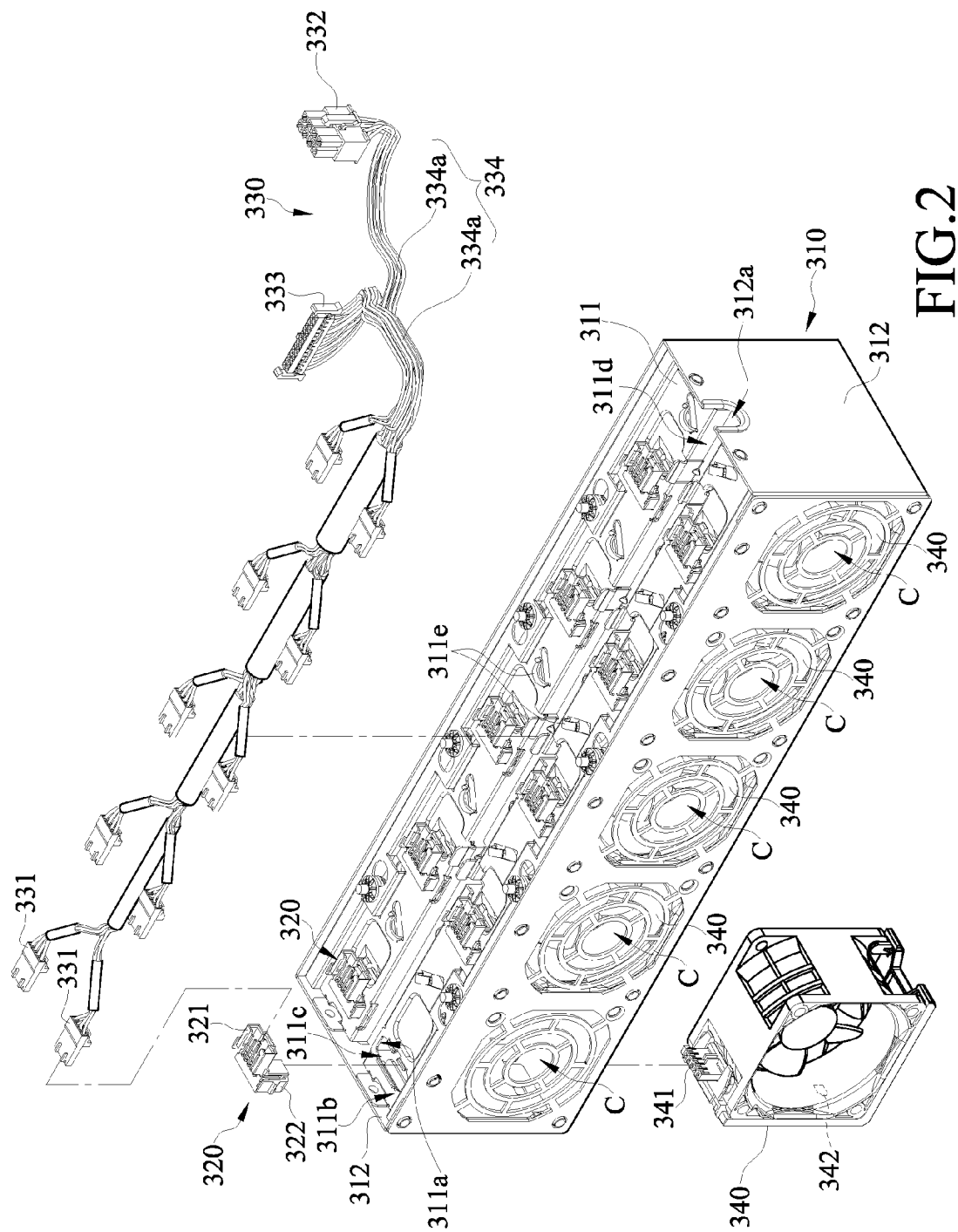
FIG. 2 is an exploded view of the electronic device according to FIG. 1.

Please refer to FIG. 1 to FIG. 2. FIG. 1 is a perspective view of an electronic device according to an embodiment of the disclosure. FIG. 2 is an exploded view of the electronic device according to FIG. 1. In this embodiment, an electronic device 10 is, but not limited to, a server. In other embodiments, the electronic device 10 is a desktop. The electronic device 10 includes a case 100, a mother board 200 and a fan module 300.

The mother board 200 is disposed in the case 100. For example, a central processing unit (CPU), a memory or expansion slots are disposed on the mother board 200. In this embodiment, a signal port 210 and a power port 220 are disposed on the mother board 200.

The fan module 300 is disposed in a middle part of the case 100. The so called middle part of the case 100 is, but not limited to, the central part on the case 100 along the long edge thereof. In other embodiments, the fan module 300 is disposed on a front part or a rear part of the case 100.

The fan module 300 includes a frame 310, a plurality of adapters 320, a transmission assembly 330 and a plurality of fan units 340.

The frame 310 includes a base 311 and two side plates 312. The base 311 has a top surface 311a and a bottom surface 311b that are opposite to each other. The two side plates 312 are connected to two sides of the base 311 that are opposite to each other, and the top surface 311a of the base 311 and the two side plates 312 together form at least one air path C. In detail, the frame 310 further includes a plurality of partition plates 313. The partition plates 313 are spaced apart from each other, connected to the base 311 and located between the two side plates 312, so that the top surface 311a of the base 311, the two side plates 312 and the partition plates 313 together form a plurality of air paths C.

In addition, the base 311 further includes a plurality of mounting holes 311c. The mounting holes 311c are corresponding to the air paths C, respectively. One of the two side plates 312 has a cable-management opening 312a. The bottom surface 311b of the base 311 has a cable-management groove 311d and a plurality of cable-management members 311e. One end of the cable-management groove 311d is connected to the cable-management opening 312a. The cable-management members 311e are adjacent to the cable-management groove 311d and spaced apart from two sides of the cable-management groove 311d.

Each adapter 320 includes a first connector 321 and a second connector 322. A plugging direction of the first connector 321 and a plugging direction of the second connector 322 are substantially orthogonal to each other. The so called plugging direction means a direction of an opening of a port of an electrical connector or a direction in which a plug is inserted. The adapters 320 are, but not limited to, embedded on the mounting hole 311c of the frame 310 of the base 311, thus the first connector 321 is able to attached and parallel to the bottom surface 311b of the base 311, and the second connector 322 is inserted into the mounting hole 311c of the base 311, protruding outward from the top surface 311a of the base 311 and located within the air path C.

In addition, both of the first connector 321 and the second connector 322 are, but not limited to, female connectors. In other embodiments, the first connector 321 is a female connector, and the second connector 322 is a male connector. In yet another embodiment, the first connector 321 is a male connector, and the second connector 322 is a female connector.

The transmission assembly 330 includes a plurality of third connectors 331, a fourth connector 332, a fifth connector 333 and a cable set 334 with a plurality of ends. The third connectors 331 are connected to one end of the cable set 334. The fourth connector 332 and the fifth connector 333 are connected to an end of the cable set 334 that is opposite to the third connectors 331. In detail, the cable set 334 includes a plurality of core wires 334a therein. Some of the core wires 334a are connected to the third connectors 331 and the fourth connector 332 for transmitting data signals. The data signal is, but not limited to, a fan control signal. The other core wires 334a are connected to the third connectors 331 and the fifth connector 333, respectively, for transmitting power signals.

The third connectors 331 are plug ports and detachably plugged into the first connectors 321, respectively. The fourth connector 332 is a power connector, and the fifth connector 333 is a fan-control-signal connector. The fourth connector 332 is detachably plugged into the signal port 210 on the mother board 200. The fifth connector 333 is detachably plugged into the power port 220 on the mother board 200.

In addition, the transmission assembly 330 is able to pass through the frame 310 from the cable-management opening 312a via the cable-management members 311e and the cable-management groove 311d for allowing the cable set 334 of the transmission assembly 330 to be located between the base 311 and the case 100 in order.

The fan unit 340 is, for example, an axial flow fan. Each fan unit 340 has a sixth connector 341. The sixth connector 341 is, for example, a plug port. The fan units 340 are located within the air paths C. The sixth connector 341 is detachably plugged into the second connector 322. The fan units 340 are electrically connected to the mother board 200 through the adapters 320 and the transmission assembly 330. In detail, when the fan unit 340 is inserted into the air path C of the frame 310, the sixth connector 341 is plugged into and electrically connected to the second connector 322. When the fan unit 340 is unplugged from the air path C of the frame 310, the sixth connector 341 is unplugged from and electrically disconnected from the second connector 322.

In addition, in this embodiment, the fan unit 340 is, but not limited to, fixed to the frame 310 via a hook 342. In other embodiments, the fan unit 340 is fixed to the frame 310 by screwing.

Moreover, the first connector 321, the second connector 322, the third connector 331, the fourth connector 332, the fifth connector 333 and the sixth connector 341 are plug ports.

Then, the processes of assembly of the electronic device 10 will be described hereinafter. Please refer to FIG. 3 to FIG. 7. FIGS. 3-7 are perspective views of the electronic device according to FIG. 1 during assembly.

Figure 3:
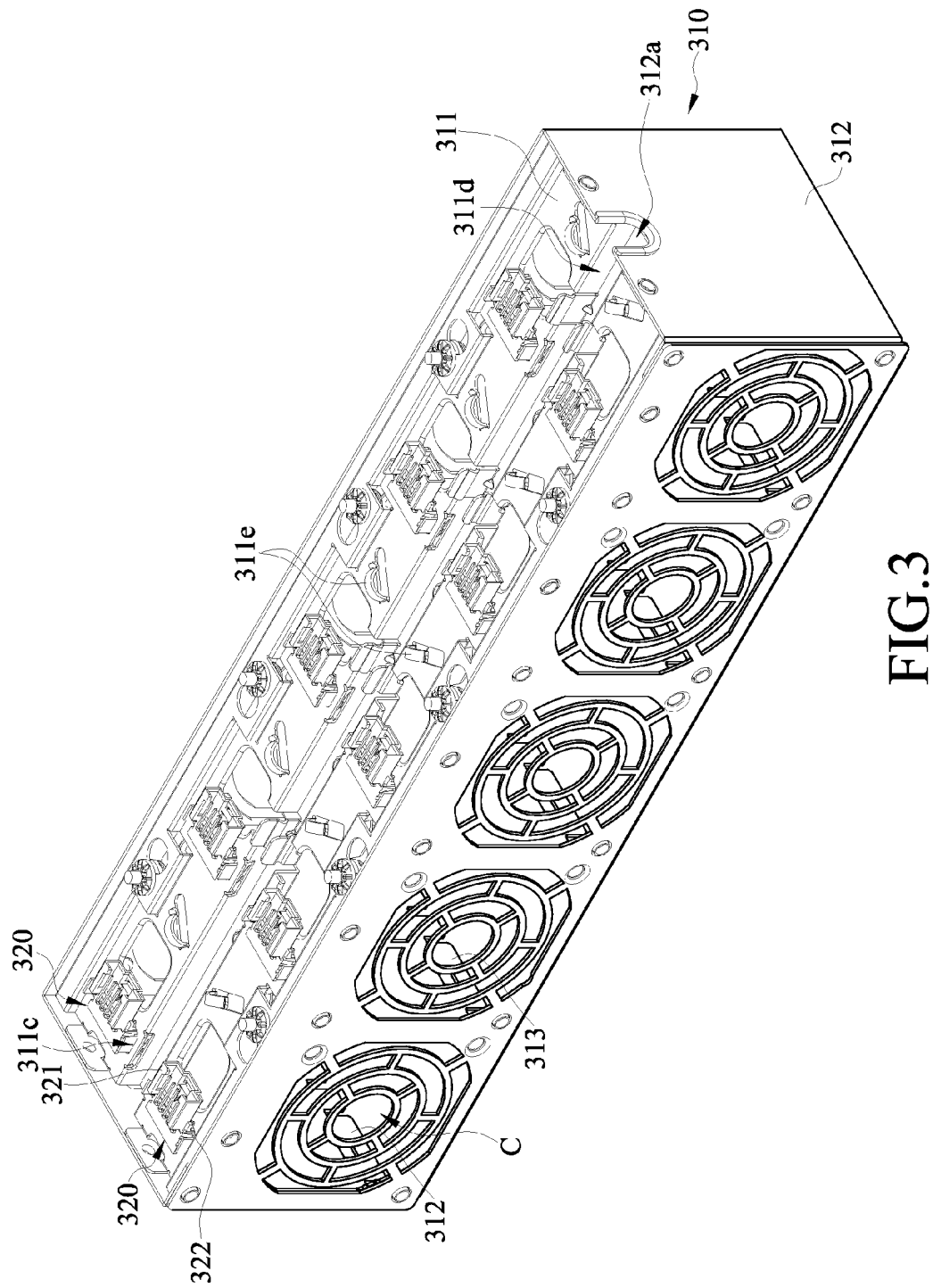
FIGS. 3-7 are perspective views of the electronic device according to FIG. 1 during assembly.

As shown in FIG. 3, the adapter 320 is mounted on the mounting hole 311c on the bottom surface 311b of the base 311, the first connector 321 is attached to the bottom surface 311b of the base 311. The second connector 322 is inserted into the mounting holes 311c on the base 311, protruding outward from the top surface 311a of the base 311 and located within the air path C.

Figure 4:
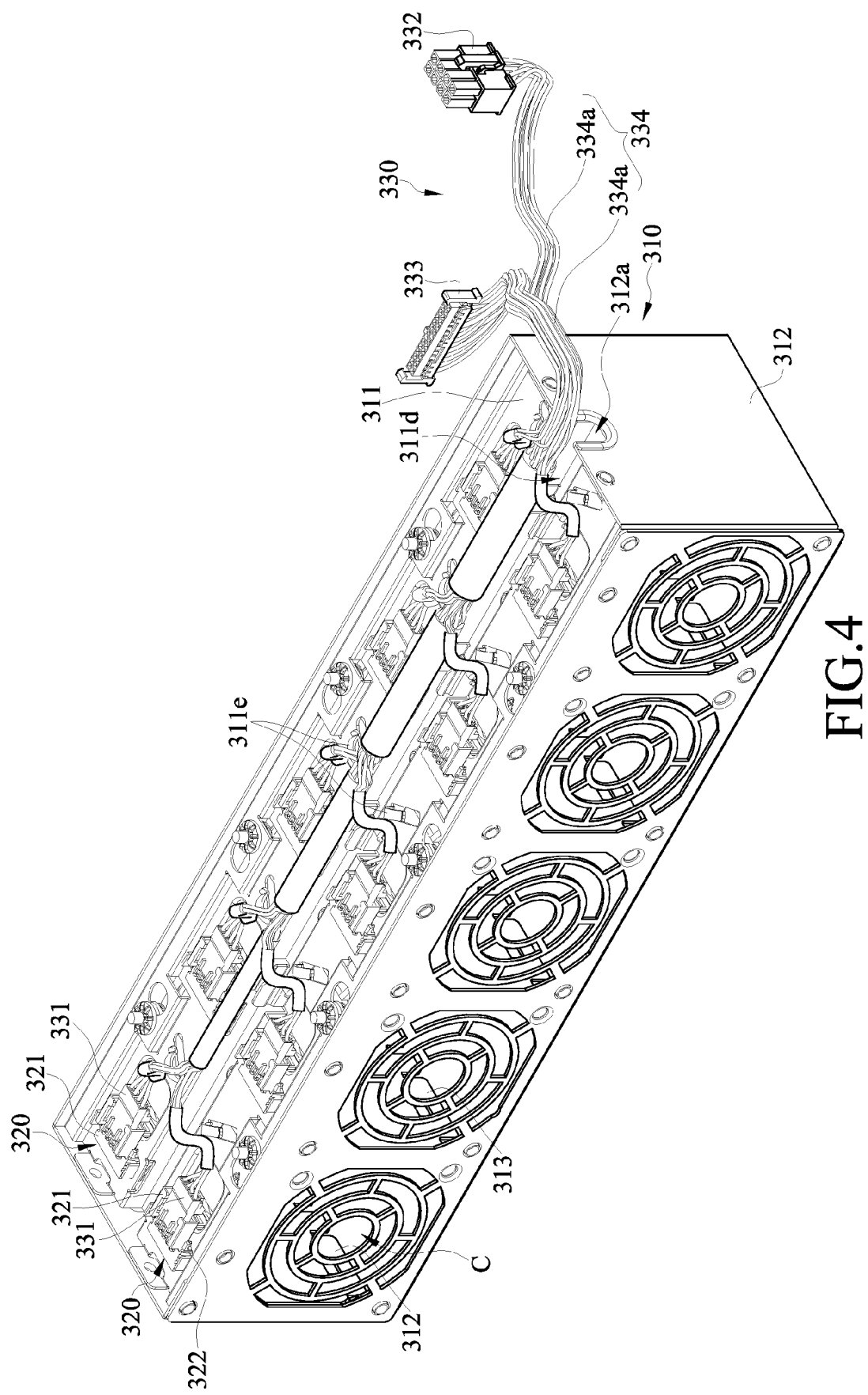

Then, as shown in FIG. 4, the third connectors 331 of the transmission assembly 330 are plugged into and electrically connected to the first connector 321, respectively.

Figure 5:
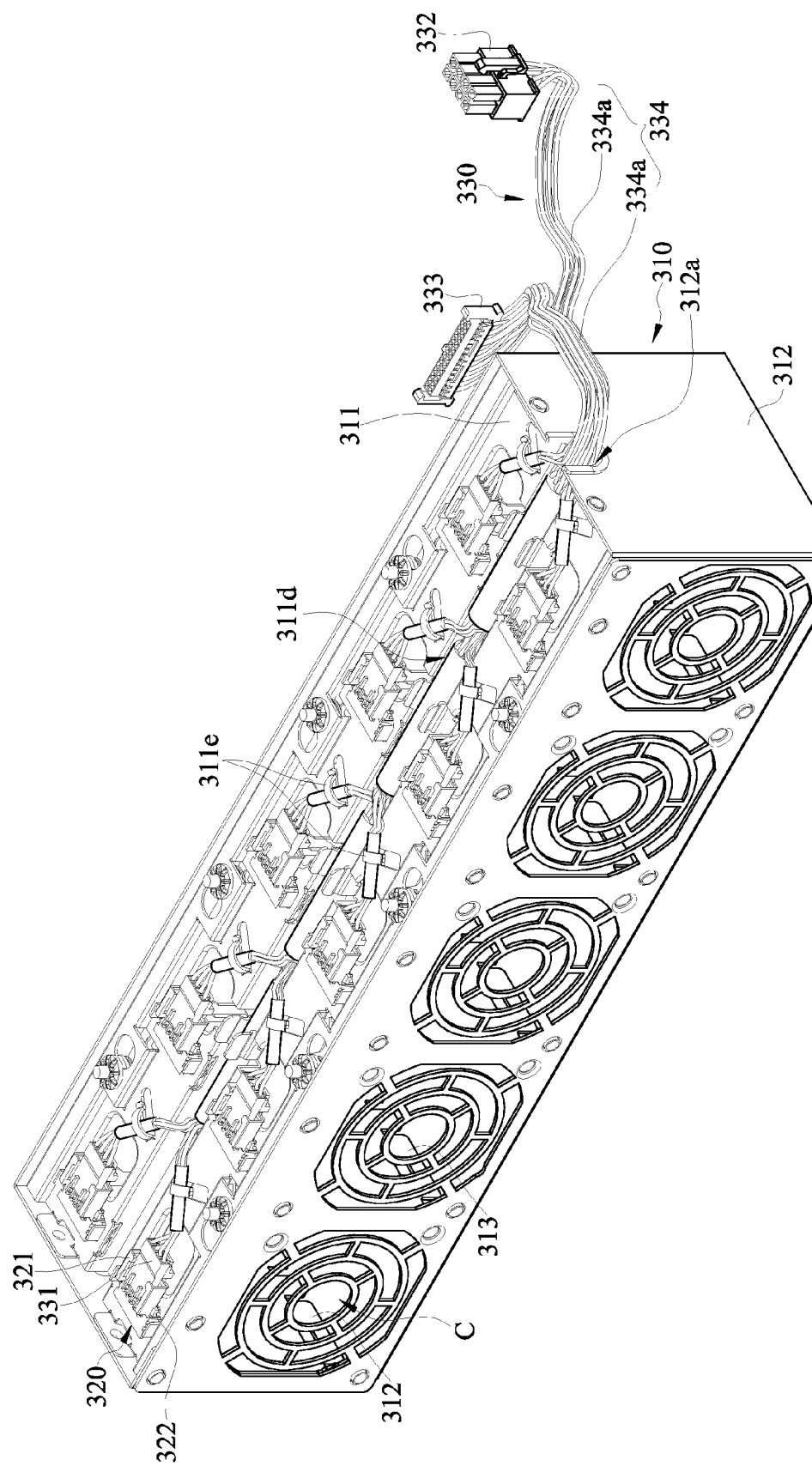

Next, as shown in FIG. 5, the cable set 334 of the transmission assembly 330 is fixed to the cable-management members 311e of the base 311 and the cable-management groove 311d, and penetrating through the cable-management opening 312a. Specifically, a part of the cable set 334 is held under the cable-management members 311e, and another part of the cable set 334 is secured within the cable-management groove 311d.

Figure 6:
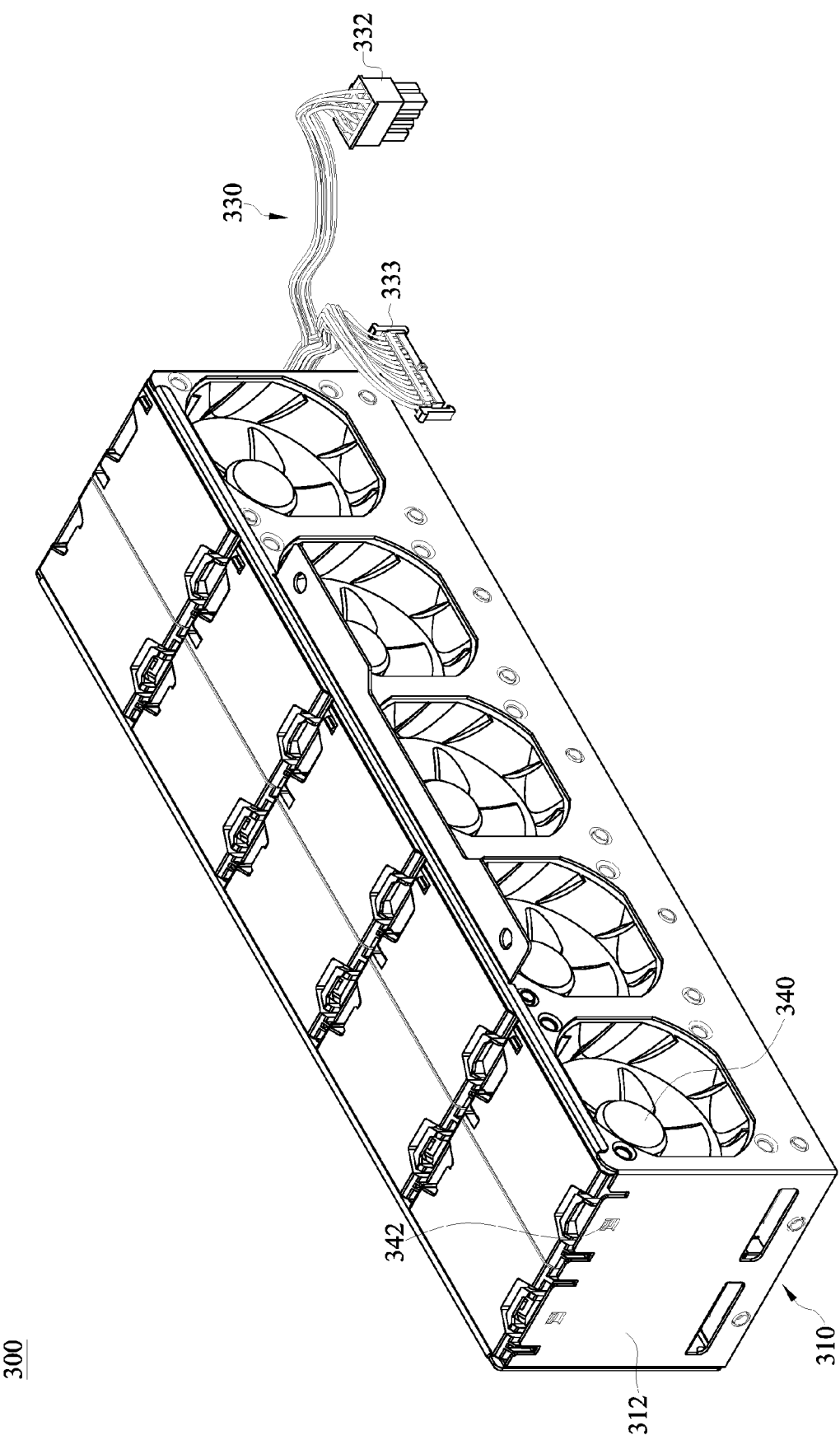

Afterwards, as shown in FIG. 6, the fan unit 340 is mounted within the air path C of the frame 310. The hook 342 of the fan unit 340 hooks the side plate 312 or the partition plate 313. The sixth connector 341 of the fan unit 340 is plugged into the second connector 322.

Figure 7:
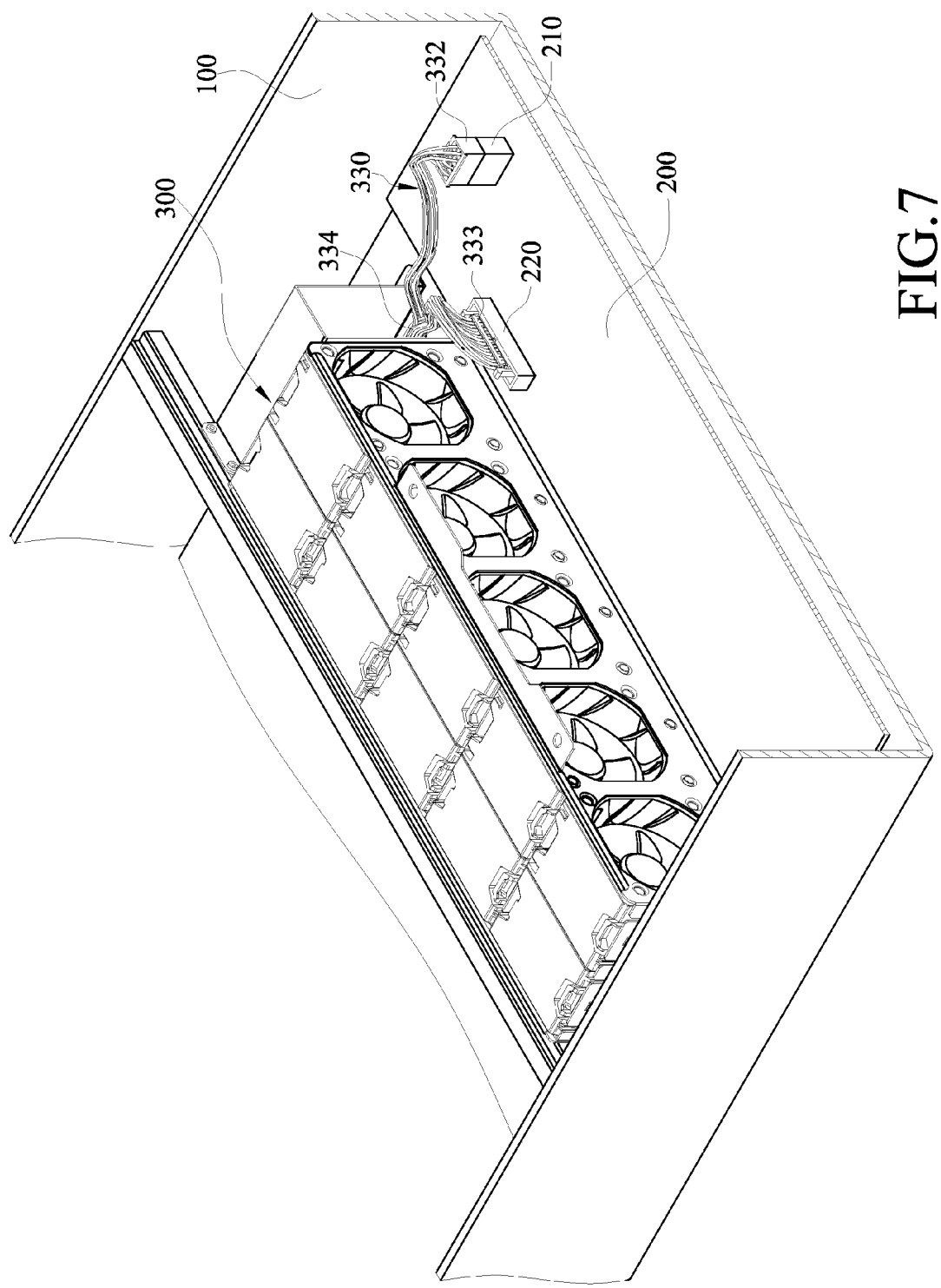

Then, as shown in FIG. 7, the frame 310 of the fan module 300 is mounted on the case 100, the fourth connector 332 and the fifth connector 333 are plugged into the signal port 210 and the power port 220 on the mother board 200, respectively. As a result, the assembly of the electronic device 10 is finished.

According to the electronic device as discussed above, the fan unit is directly inserted on the mother board via the adapter and the transmission assembly, rather than being inserted on the mother board via an extra circuit board, thus the manufacturing cost of the electronic device is reduced and the competition of market is increased.

In addition, because there is no extra circuit board disposed in the electronic device, the use of the space in the server is able to be optimized for solving the problem that the space in the server is occupied by the extra circuit board.

Furthermore, due to the arrangement of the frame, the adapters and the transmission assembly, users are able to quickly position and mount the fan units in the electronic device for improving the assembly efficiency of the electronic device. Therefore, both the assembly efficiency is enhanced and manufacturing cost is reduced simultaneously.

What is claimed is:

1. An electronic device, comprising:
   a case;
   a mother board disposed on the case; and
   a fan module disposed on the case, the fan module comprising:
      a frame comprising a base and two side plates, the base having a top surface and a bottom surface, the two side plates being connected to two sides of the base that are opposite to each other, the top surface of the base and the two side plates together form at least one air path, one of the two side plates having a cable-management opening, the bottom surface of the base having a cable-management groove and a plurality of cable-management members, one end of the cable-management groove being connected to the cable-management opening, and the plurality of cable-management members being adjacent to the cable-management groove;
      a plurality of adapters being mounted on the base of the frame, each of the plurality of adapters comprising a first connector and a second connector, a plugging direction of the first connector and a plugging direction of the second connector being substantially orthogonal to each other, the first connector being attached to the bottom surface of the base, and the second connector being inserted on the base, protruding outward from the top surface of the base and located within the at least one air path;
      a transmission assembly comprising a plurality of third connectors, a fourth connector, a fifth connector and a cable set, the cable set connecting the plurality of third connectors and the fourth connector and connecting the plurality of third connectors and the fifth connector, the plurality of third connectors being detachably plugged into the first connectors, respectively, the fourth connector and the fifth connector being connected to an end of the cable set which is opposite to the plurality of third connectors, the transmission assembly passing through the frame from the cable-management opening via the plurality of cable-management members and the cable-management groove, allowing the fourth connector and the fifth connector to be located out of the frame and detachably plugged into the mother board; and
      a plurality of fan units each comprising a sixth connector, the plurality of fan units being located within the at least one air path, the sixth connector being detachably plugged into the second connector, and the plurality of fan units for being electrically connected to the mother board through the transmission assembly.

2. The electronic device according to claim 1, wherein when the plurality of adapters are mounted on the bottom surface of the base, the plurality of third connectors of the transmission assembly are plugged into and electrically connected to the first connectors, respectively, and the cable set of the transmission assembly is fixed to the plurality of cable-management members of the base and the cable-management groove and passes though the cable-management opening so as to fix the frame to the case.

3. The electronic device according to claim 1, wherein when the plurality of fan units is inserted in the at least one air path of the frame, the sixth connector is plugged into and electrically connected to the second connector, and when the plurality of fan units is unplugged from the at least one air path of the frame, the sixth connector is unplugged from and electrically disconnected from the second connector.

4. The electronic device according to claim 1, wherein the fan unit has a hook for hooking the frame.

5. The electronic device according to claim 1, wherein the base further has a plurality of mounting holes, the second connector of one of the plurality of adapters passes through one of the plurality of mounting holes and is joined to the base.

6. The electronic device according to claim 1, wherein the plurality of adapters is hooked on the base.

7. The electronic device according to claim 1, wherein the at least one air path is plural in number, the frame further comprises a plurality of partition plates, the partition plates are spaced apart from each other, connected to the base, and located between the two side plates, and the plurality of partition plates and the base together form the air paths.

8. The electronic device according to claim 1, wherein the first connector of the plurality of the adapters is a male connector, the second connector is a female connector.

9. The electronic device according to claim 1, wherein the first connector of each of the plurality of adapters is a female connector, the second connector is a male connector.

10. The electronic device according to claim 1, wherein the plurality of third connectors and the sixth connector are insertion ports for receiving plugs transmitting a fan control signal and a power signal, respectively.

11. The electronic device according to claim 1, wherein the fourth connector is a power connector.

12. The electronic device according to claim 1, wherein the fifth connector is a fan control signal connector.

13. The electronic device according to claim 1, wherein the fan module is disposed in a middle part of the case.

14. The electronic device according to claim 1, wherein the plurality of third connectors are connected to one end of the cable set.

15. The electronic device according to claim 1, wherein the fourth connector and the fifth connector are connected to an end of the cable set that is opposite to the plurality of third connectors.

16. The electronic device according to claim 1, wherein the cable set includes a plurality of core wires, some of the plurality of core wires are connected to the plurality of third connectors and the fourth connector for transmitting data signals, and the other core wires are connected to the plurality of third connectors and the fifth connector, respectively, for transmitting power signals.

* * * * *